US010849252B2

(12) United States Patent
Sun et al.

(10) Patent No.: US 10,849,252 B2
(45) Date of Patent: Nov. 24, 2020

(54) CONVERTER

(71) Applicant: DELTA ELECTRONICS, INC., Taoyuan (TW)

(72) Inventors: Yi-Heng Sun, Taoyuan (TW); Yung-Jen Cheng, Taoyuan (TW); Kai-Ti Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/381,714

(22) Filed: Apr. 11, 2019

(65) Prior Publication Data
US 2019/0327858 A1   Oct. 24, 2019

Related U.S. Application Data

(60) Provisional application No. 62/659,380, filed on Apr. 18, 2018.

(30) Foreign Application Priority Data

Jan. 11, 2019   (CN) ........................ 2019 1 0027913

(51) Int. Cl.
  *H05K 7/20*   (2006.01)
  *H05K 5/06*   (2006.01)
  *H02M 7/00*   (2006.01)
(52) U.S. Cl.
  CPC ........ *H05K 7/20409* (2013.01); *H02M 7/003* (2013.01); *H05K 5/061* (2013.01); *H05K 7/20136* (2013.01); *H05K 7/20909* (2013.01)

(58) Field of Classification Search
  CPC .......... H05K 7/20409; H05K 7/20909; H05K 5/061; H05K 7/20136; H02M 7/003
  USPC ......................................................... 361/697
  See application file for complete search history.

(56) References Cited

U.S. PATENT DOCUMENTS

| | | | | | |
|---|---|---|---|---|---|
| 3,829,741 | A | * | 8/1974 | Athey | H05K 3/366 |
| | | | | | 361/756 |
| 5,091,823 | A | * | 2/1992 | Kanbara | H02M 5/44 |
| | | | | | 174/351 |
| 5,424,915 | A | * | 6/1995 | Katooka | H05K 7/20909 |
| | | | | | 361/695 |
| 7,280,373 | B2 | * | 10/2007 | Aizawa | G06F 1/184 |
| | | | | | 361/792 |

(Continued)

FOREIGN PATENT DOCUMENTS

| CN | 201947153 U | 8/2011 |
|---|---|---|
| CN | 202455251 U | 9/2012 |

(Continued)

*Primary Examiner* — Anatoly Vortman
(74) *Attorney, Agent, or Firm* — Muncy, Geissler, Olds & Lowe, P.C.

(57) ABSTRACT

A converter is provided. The converter includes a housing, a circuit board unit, a heat source member, a fan, and a first heat sink. A waterproof area and a ventilation area are formed in the housing. The circuit board unit is disposed in the waterproof area. The heat source member is disposed in the waterproof area and coupled to the circuit board unit. The fan is disposed in the ventilation area, wherein the fan is adapted to generate an air flow. The first heat sink is disposed in the ventilation area, and thermally connected to the heat source member, wherein the air flow is adapted to pass through the first heat sink.

18 Claims, 5 Drawing Sheets

(56) References Cited

U.S. PATENT DOCUMENTS

| | | | | |
|---|---|---|---|---|
| 8,199,500 B2* | 6/2012 | Yamagiwa | ......... | H05K 7/20127 |
| | | | | 165/104.34 |
| 8,243,447 B2* | 8/2012 | Fujiki | ................ | H05K 7/20918 |
| | | | | 165/185 |
| 8,611,088 B2* | 12/2013 | Barna | ................ | H05K 7/20145 |
| | | | | 165/104.33 |
| 9,545,037 B2* | 1/2017 | Tyleshevski | ....... | H05K 7/20909 |
| 10,098,256 B2* | 10/2018 | Amano | .............. | H05K 7/20145 |
| 2014/0198455 A1* | 7/2014 | Masuda | ................. | H05K 7/209 |
| | | | | 361/720 |
| 2014/0246169 A1* | 9/2014 | Perrin | ................. | H05K 7/2089 |
| | | | | 165/47 |
| 2015/0022972 A1* | 1/2015 | Kwon, II | ............. | H05K 1/0201 |
| | | | | 165/120 |
| 2015/0062811 A1* | 3/2015 | Suzuki | ...................... | B61C 3/00 |
| | | | | 361/690 |
| 2015/0285255 A1* | 10/2015 | Tsujimoto | ............. | H02M 7/003 |
| | | | | 417/44.1 |
| 2017/0188488 A1* | 6/2017 | Takezawa | .............. | H02M 7/48 |
| 2018/0070471 A1* | 3/2018 | Amano | .............. | H05K 7/20909 |

FOREIGN PATENT DOCUMENTS

| | | |
|---|---|---|
| CN | 203377773 U | 1/2014 |
| CN | 206402088 U | 8/2017 |
| EP | 0951208 A2 | 10/1999 |

* cited by examiner

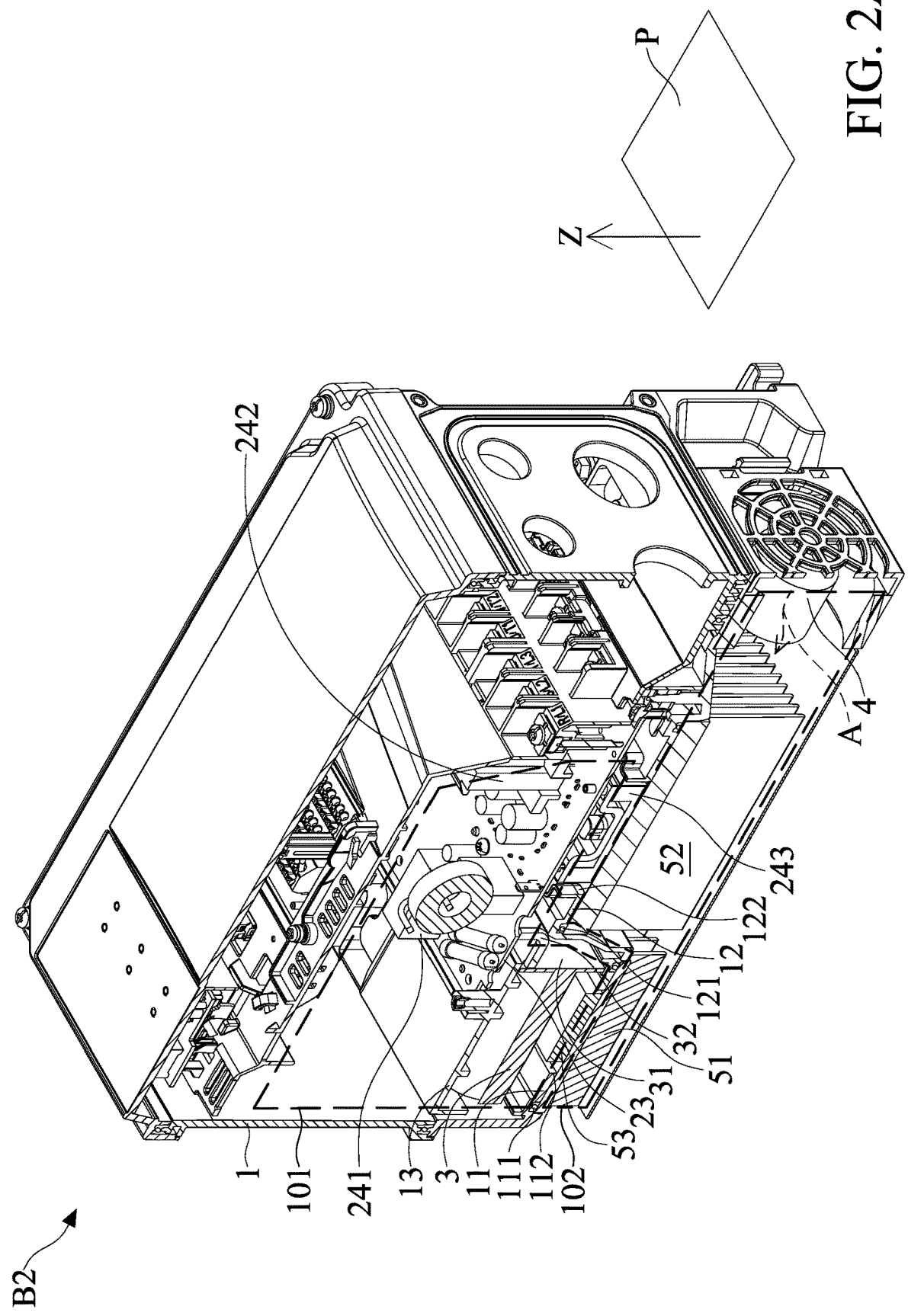

CONVERTER

CROSS REFERENCE TO RELATED APPLICATIONS

This application claims the benefit of U.S. Provisional Application No. 62/659,380, filed Apr. 18, 2018, the entirety of which is incorporated by reference herein.

This Application claims priority of China Patent Application No. 201910027913.5, filed on Jan. 11, 2019, the entirety of which is incorporated by reference herein.

BACKGROUND OF THE INVENTION

Field of the Invention

The present invention relates to a converter, and in particular to a converter with improved heat dissipation.

Description of the Related Art

A capacitor is one of the heat sources inside a converter. Conventionally, a capacitor is connected to an outer cooling system by a bushing, and the heat of the capacitor is removed by the bushing. However, this conventional design is not adequately waterproof, and the capacitor can be easily damaged by moisture.

In another conventional design, the capacitor is disposed in a waterproof area inside the converter, and a fan is disposed in the waterproof area to dissipate the heat from the capacitor. However, the fan occupies the limited space of the waterproof area, and the amount of available space inside the converter is decreased.

BRIEF SUMMARY OF THE INVENTION

In one embodiment, a converter is provided. The converter includes a housing, a circuit board unit, a heat source member, a fan, and a first heat sink. A waterproof area and a ventilation area are formed in the housing. The circuit board unit is disposed in the waterproof area. The heat source member is disposed in the waterproof area and coupled to the circuit board unit. The fan is disposed in the ventilation area, wherein the fan is adapted to generate an air flow. The first heat sink is disposed in the ventilation area, and thermally connected to the heat source member, wherein the air flow is adapted to pass through the first heat sink.

In one embodiment, the converter further comprises a heat conductive layer, wherein the heat conductive layer is disposed in the waterproof area and is sandwiched between the heat source member and the first heat sink.

In one embodiment, the converter further comprises an adapter board, wherein the adapter board is disposed in the waterproof area and is coupled to the circuit board unit, the adapter board is perpendicular to the circuit board unit, and the heat source member is connected to the adapter board.

In one embodiment, on a projection plane, a projection of the circuit board unit, a projection of the heat source member and a projection of the first heat sink partially overlap each other.

In one embodiment, the heat source member comprises a capacitor.

In one embodiment, the converter further comprises a relay, wherein the relay is disposed in the waterproof area and is disposed on the circuit board unit, and the relay corresponds to the capacitor.

In one embodiment, the converter further comprises a transformer, an output control unit and a second heat sink, wherein the transformer and the output control unit are disposed on the circuit board unit, the transformer corresponds to the second heat sink, the second heat sink is thermally connected to the output control unit, the transformer and the output control unit are disposed in the waterproof area, the second heat sink is disposed in the ventilation area, and the air flow is adapted to pass through the second heat sink.

In one embodiment, the second heat sink is located between the first heat sink and the fan.

In one embodiment, the circuit board unit comprises a first circuit board and a second circuit board, the relay is disposed on the first circuit board, the transformer and the output control unit are disposed on the second circuit board, the second circuit board comprises a first surface and a second surface, the first surface is opposite the second surface, the transformer is disposed on the first surface, and the output control unit is disposed on the second surface.

In one embodiment, on a projection plane, a projection of the first circuit board, a projection of the capacitor, and a projection of the first heat sink partially overlap each other, and a projection of the second circuit board and a projection of the second heat sink partially overlap each other.

In one embodiment, the housing further comprises a spacer, the spacer is disposed between the first circuit board and the capacitor, and the first circuit board is affixed to the spacer.

In one embodiment, the converter further comprises a first stopper and a first waterproof ring, the first stopper has a first opening, the first heat sink covers the first opening, the first waterproof ring is embedded in the first stopper and abuts the first heat sink, and the first heat sink is thermally connected to the capacitor via the first opening.

In one embodiment, the converter further comprises a second stopper and a second waterproof ring, the second stopper has a second opening, the second heat sink covers the second opening, the second waterproof ring is embedded in the second stopper and abuts the second heat sink, and the second heat sink is thermally connected to the output control unit via the second opening.

In another embodiment, the invention further provides a converter, which includes a circuit board unit, an adapter board, a capacitor and a first heat sink. The adapter board is coupled to the circuit board unit, wherein the adapter board is perpendicular to the circuit board unit. The capacitor is connected to the adapter board. The first heat sink is thermally connected to the capacitor.

Utilizing the converter of the embodiment of the invention, since there is no additional fan disposed inside the waterproof area, the cost is reduced, and the available space inside the waterproof area is increased. Particularly, the capacitor is disposed under the circuit board unit, and the space utilization inside the housing is increased. In the embodiment of the invention, the first stopper, the first heat sink, the second stopper and the second heat sink separate and define the waterproof area and the ventilation area, and the waterproof ability, and space utilization, the reliability and the heat dissipation are improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2A shows an inner structure of a converter of a second embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
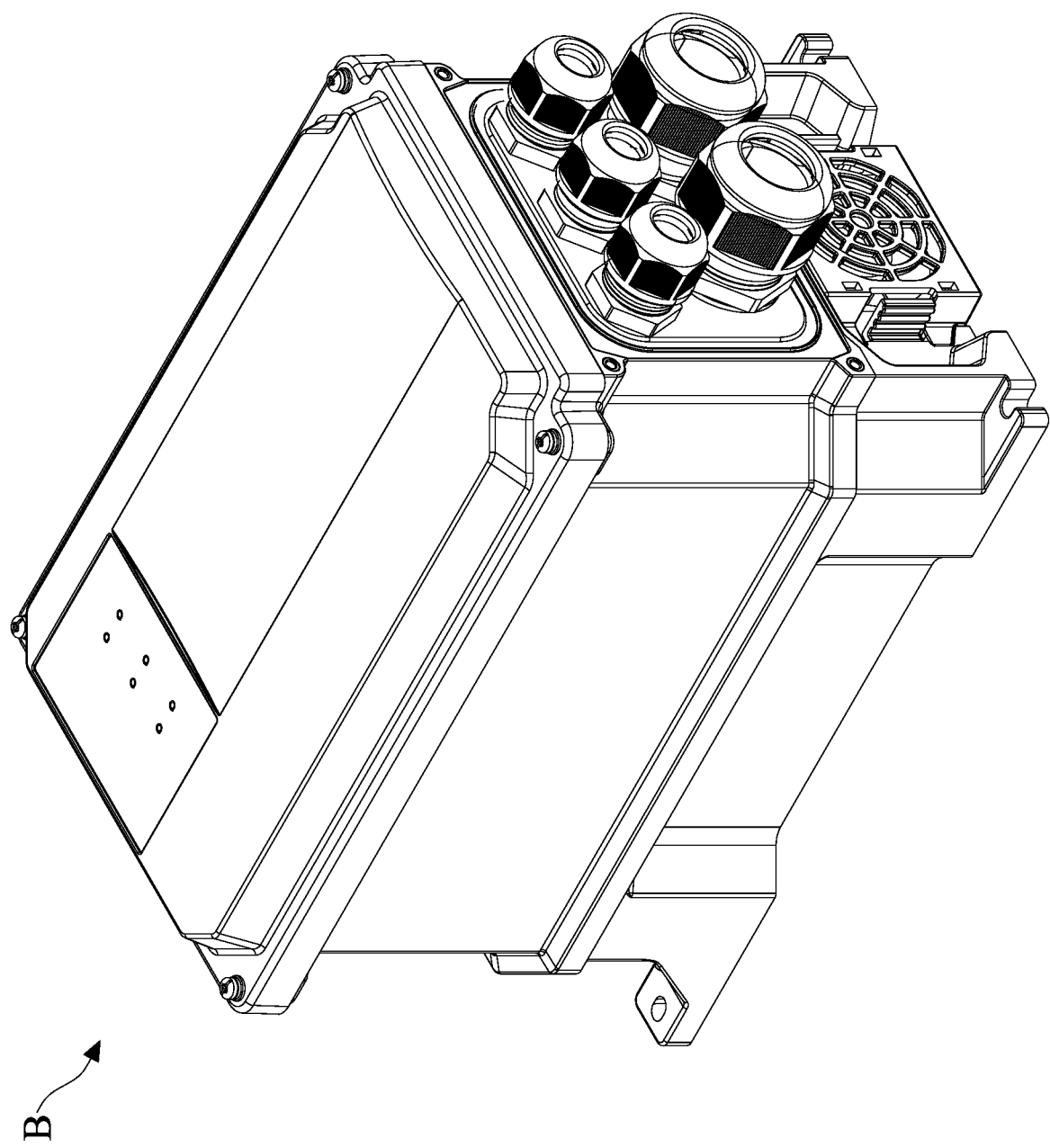
FIG. 1A is a perspective view of a converter of an embodiment of the invention.
Figure 1B:
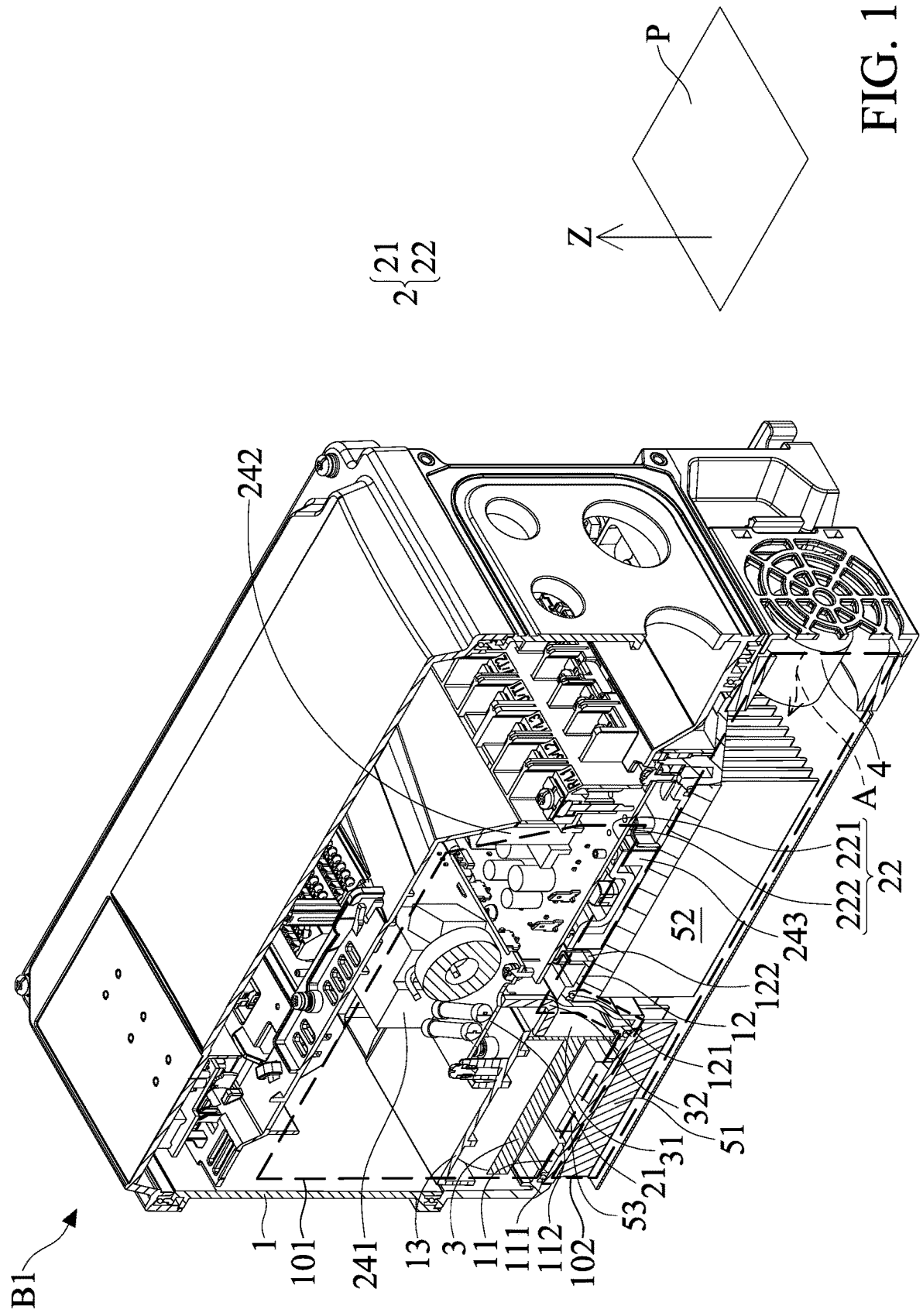
FIG. 1B shows an inner structure of a converter of a first embodiment of the invention.
Figure 1C:
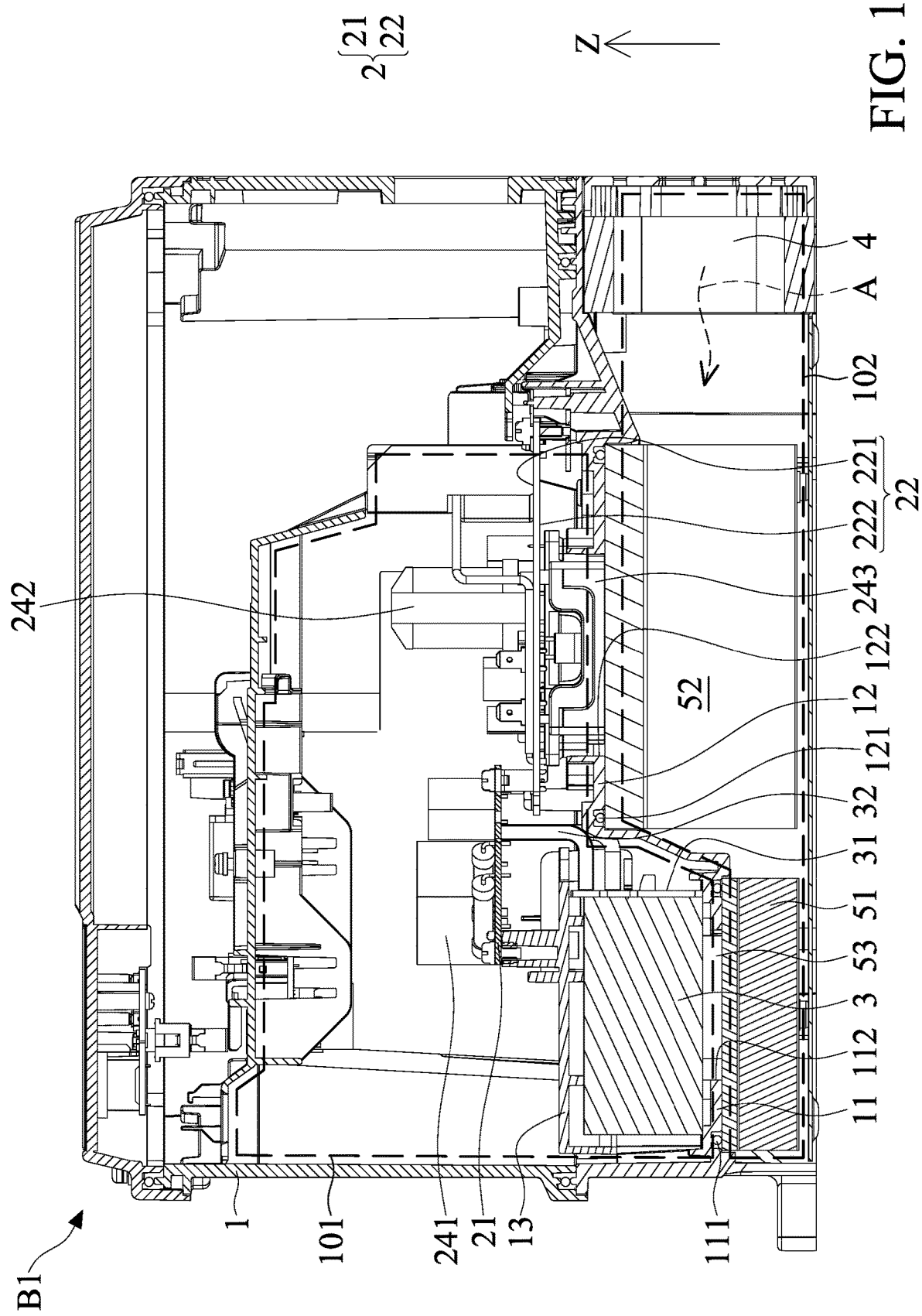
FIG. 1C is a cross sectional view of the converter of the first embodiment of the invention.

FIG. 1A is a perspective view of a converter B of an embodiment of the invention. FIG. 1B shows an inner structure of a converter B1 of a first embodiment of the invention. FIG. 1C is a cross sectional view of the converter B1 of the first embodiment of the invention. With reference to FIGS. 1A, 1B and 1C, the converter B1 of the first embodiment of the invention includes a housing 1, a circuit board unit 2, a heat source member 3, a fan 4 and a first heat sink 51. A waterproof area 101 and a ventilation area 102 are formed in the housing 1. The circuit board unit 2 is disposed in the waterproof area 101. In this embodiment and other embodiments of the invention, the heat source member 3 includes a capacitor. However, the disclosure is not meant to restrict the invention. The capacitor 3 is disposed in the waterproof area 101 and coupled to the circuit board unit 2. The fan 4 is disposed in the ventilation area 102, wherein the fan 4 is adapted to generate an air flow A. The first heat sink 51 is disposed in the ventilation area 102, and thermally connected to the capacitor 3. The air flow A is adapted to pass through the first heat sink 51, contacts the first heat sink 51 and removes the heat therefrom. In one embodiment, the capacitor 3 can be replaced by power module, switch member or other heat source members, which can be disposed on the located where the capacitor 3 is in this embodiment.

With reference to FIGS. 1B and 1C, in one embodiment, the converter B1 further comprises a heat conductive layer 53. The heat conductive layer 53 is disposed in the waterproof area 101 and is sandwiched between the capacitor 3 and the first heat sink 51. The heat conductive layer 53 is utilized as an intermediary layer to enhance the thermal connection between the capacitor 3 and the first heat sink 51. The heat conductive layer 53 can also be replaced by thermal pad, thermal paste or other similar heat conductive elements. In another embodiment, the capacitor 3 can also be directly connected to the first heat sink 51. The disclosure is not meant to restrict the invention.

With reference to FIGS. 1B and 1C, in one embodiment, the converter B1 further comprises an adapter board 31, wherein the adapter board 31 is disposed in the waterproof area 101 and is coupled to the circuit board unit 2. The adapter board 31 is perpendicular to the circuit board unit 2, and the capacitor 3 coupled to the circuit board unit 2 via the adapter board 31.

With reference to FIGS. 1B and 1C, in this embodiment, the adapter board 31 is coupled to the circuit board unit 2 via a cable 32. In another embodiment, the adapter board 31 can be inserted to a connector (not shown) of the circuit board unit 2 to be coupled to the circuit board unit 2. The disclosure is not meant to restrict the invention.

With reference to FIGS. 1B and 1C, in one embodiment, on a projection plane P in a first direction Z, a projection of the circuit board unit 2, a projection of the capacitor 3 and a projection of the first heat sink 51 partially overlap each other. As shown in FIGS. 1B and 1C, the capacitor 3 can be horizontally below the circuit board unit 2. In this embodiment, the position of the capacitor 3 is sufficiently corresponding to the first heat sink 51. The first heat sink 51 is thermally connected to the capacitor 3. The first heat sink 51 removes the heat from the capacitor 3, and then the heat is taken away by the air flow A.

With reference to FIG. 1A, in one embodiment, the converter B1 further comprises a relay 241, wherein the relay 241 is disposed in the waterproof area 101 and is disposed on the circuit board unit 2. The relay 241 corresponds to the capacitor 3. Particularly, the relay 241 and the capacitor 3 are disposed on different sides of the circuit board unit 2. In one embodiment, the relay 241 is disposed on an upper surface of the circuit board unit 2, and the capacitor 3 is disposed on a lower surface of the circuit board unit 2.

With reference to FIGS. 1B and 1C, in one embodiment, the converter B1 further comprises a transformer 242, an output control unit 243 and a second heat sink 52. The transformer 242 and the output control unit 243 are disposed on the circuit board unit 2. The transformer 242 corresponds to the second heat sink 52. The second heat sink 52 is thermally connected to the output control unit 243. The transformer 242 and the output control unit 243 are disposed in the waterproof area 101, the second heat sink 52 is disposed in the ventilation area 102, and the air flow A is adapted to pass through the second heat sink 52, contacts the second heat sink 52 and removes the heat therefrom.

In one embodiment, the second heat sink 52 is directly connected to the output control unit 243. In another embodiment, a heat conductive layer or a thermal paste can be disposed between the second heat sink 52 and the output control unit 243. The disclosure is not meant to restrict the invention. The heat generated by the transformer 242 and the output control unit 243 is conducted by the second heat sink 52, and is removed by the air flow A.

With reference to FIG. 1A, in one embodiment, the second heat sink 52 is located between the first heat sink 51 and the fan 4. The air flow A passes through the second heat sink 52 first, and then passes through the first heat sink 51. However, the disclosure is not meant to restrict the invention. For example, in another embodiment, the air flow A can travel in opposite direction.

With reference to FIGS. 1B, and 1c, in this embodiment, the circuit board unit 2 comprises a first circuit board 21 and a second circuit board 22. A height difference is formed between the first circuit board 21 and the second circuit board 22. The electronic elements can be arranged to the first circuit board 21 and the second circuit board 22 according to the design requirement, and the space utilization of the waterproof area 101 can be improved with the design of the housing 1. The relay 241 is disposed on the first circuit board 21. The transformer 242 and the output control unit 243 are disposed on the second circuit board 22. The second circuit board 22 comprises a first surface 221 and a second surface 222. The first surface 221 is opposite the second surface 222. The transformer 242 is disposed on the first surface 221, and the output control unit 243 is disposed on the second surface 222. The design of the first circuit board 21 and the second circuit board 22 improves the utilization flexibility inside the housing 1. The disclosure is not meant to restrict the invention.

In one embodiment, the first circuit board 21 is coupled to the second circuit board 22 via a cable or a connector. The disclosure is not meant to restrict the invention.

In one embodiment, the output control unit 243 can be an insulated gate bipolar transistor (IGBT), a bipolar junction transistor (BJT), a metal-oxide-semiconductor field-effect transistor (MOSFET) or other similar electronic element which can control circuit switch. The disclosure is not meant to restrict the invention.

With reference to FIGS. 1B and 1C, in one embodiment, on the projection plane P in the first direction Z, a projection of the first circuit board 21, a projection of the capacitor 3 and a projection of the first heat sink 51 partially overlap each other, and a projection of the second circuit board 22 and a projection of the second heat sink 52 partially overlap each other. The arrangement above overlaps the heat transmission paths of the heat source member and the heat sink, and the heat dissipation efficiency is therefore improved.

With reference to FIGS. 1B and 1C, in one embodiment, the housing further comprises a spacer 13. The spacer 13 is disposed between the first circuit board 21 and the capacitor 3, and the first circuit board 21 is affixed to the spacer 13. In one embodiment, the spacer 13 also supports the adapter board 31. The disclosure is not meant to restrict the invention.

With reference to FIGS. 1B and 1C, in one embodiment, the converter B1 further comprises a first stopper 11 and a first waterproof ring 111. The first stopper 11 has a first opening 112. The first heat sink 51 covers the first opening 112. The first waterproof ring 111 is embedded in the first stopper 11 and abuts the first heat sink 51. The first heat sink 51 is thermally connected to the capacitor 3 via the first opening 112.

With reference to FIGS. 1B and 1C, in one embodiment, the converter B1 further comprises a second stopper 12 and a second waterproof ring 121. The second stopper 12 has a second opening 122. The second heat sink 52 covers the second opening 122. The second waterproof ring 121 is embedded in the second stopper 12 and abuts the second heat sink 52. The second heat sink 52 is thermally connected to the output control unit 243 via the second opening 122.

In one embodiment, the first heat sink 51 and the second heat sink 52 has fin structure to increase heat dissipation area. For example, the fin structure can be formed on the side of the first heat sink 51 that is opposite the side being thermally connected to the capacitor 3. The first heat sink 51 and the second heat sink 52 can be formed by aluminum extrusion to tightly contact the waterproof rings. The converter of the embodiment of the invention has lower cost relative to the conventional bushing design, and has improved tightness and reliability. The disclosure is not meant to restrict the invention.

Utilizing the converter of the embodiment of the invention, since there is no additional fan disposed inside the waterproof area, the cost is reduced, and the available space inside the waterproof area is increased. Particularly, the capacitor is disposed under the circuit board unit, and the space utilization inside the housing is increased. In the embodiment of the invention, the first stopper, the first heat sink, the second stopper and the second heat sink separate and define the waterproof area and the ventilation area, and the waterproof ability, and space utilization, the reliability and the heat dissipation are improved.

In another embodiment, base one other consideration and design, the fan can also disposed in the waterproof area of the structure of the embodiment of the invention. The disclosure is not meant to restrict the invention.

Figure 2B:
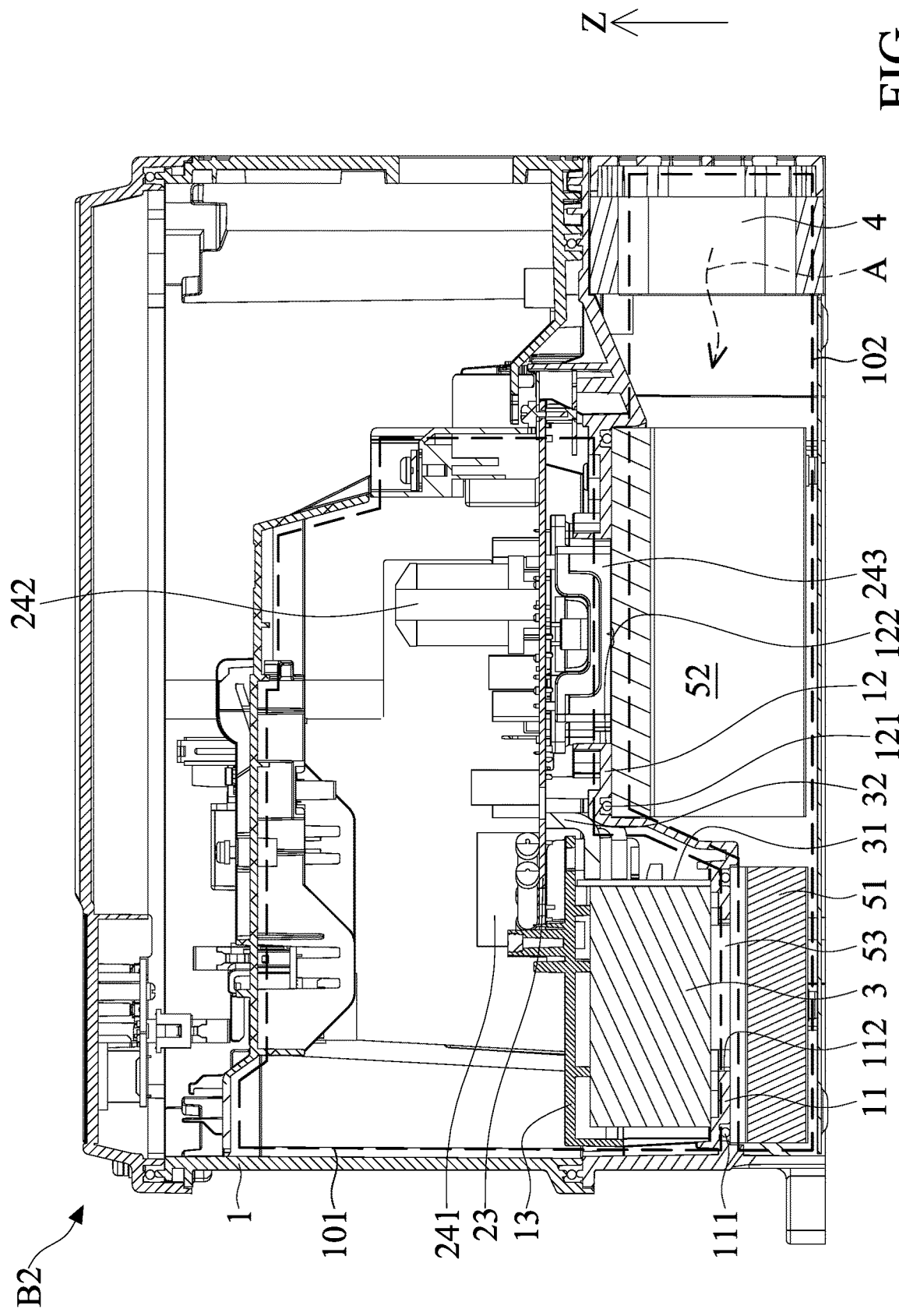
FIG. 2B is a cross sectional view of the converter of the second embodiment of the invention.

FIG. 2A shows an inner structure of a converter B2 of a second embodiment of the invention. FIG. 2B is a cross sectional view of the converter B2 of the second embodiment of the invention. With reference to FIGS. 2A and 2B, in the converter B2 of the second embodiment of the invention, the circuit board unit has only one circuit board 23. The relay 241, the transformer 242 and the output control unit 243 as mentioned above are all disposed on the circuit board 23. Utilizing the converter of the second embodiment of the invention, only one circuit board is used, and no additional mechanism is required to elevate a portion of the circuit board. The cost of the circuit board unit and the whole converter is further decreased.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A converter, comprising:
    a housing, wherein a waterproof area and a ventilation area are formed in the housing;
    a circuit board unit, disposed in the waterproof area;
    a heat source member, disposed in the waterproof area and coupled to the circuit board unit;
    a fan, disposed in the ventilation area, wherein the fan is adapted to generate an air flow;
    a first heat sink, disposed in the ventilation area, and thermally connected to the heat source member, wherein the air flow is adapted to pass through the first heat sink, wherein the first heat sink has a fin structure formed on a first side of the first heat sink, the heat source member is thermally connected to a second side of the first heat sink, and the first side is opposite to the second side; and
    an adapter board, wherein the adapter board is disposed in the waterproof area and is coupled to the circuit board unit, the adapter board is perpendicular to the circuit board unit, and the heat source member is connected to the adapter board, wherein the adapter board is located between the first heat sink and the circuit board unit.

2. The converter as claimed in claim 1, further comprising a heat conductive layer, wherein the heat conductive layer is disposed in the waterproof area and is sandwiched between the heat source member and the first heat sink.

3. The converter as claimed in claim 1, wherein on a projection plane, a projection of the circuit board unit, a projection of the heat source member and a projection of the first heat sink partially overlap each other.

4. The converter as claimed in claim 1, wherein the heat source member comprises a capacitor.

5. The converter as claimed in claim 4, further comprising a relay, wherein the relay is disposed in the waterproof area and is disposed on the circuit board unit, and the relay corresponds to the capacitor.

6. The converter as claimed in claim 5, further comprising a transformer, an output control unit and a second heat sink, wherein the transformer and the output control unit are disposed on the circuit board unit, the transformer corresponds to the second heat sink, the second heat sink is thermally connected to the output control unit, the transformer and the output control unit are disposed in the waterproof area, the second heat sink is disposed in the ventilation area, and the air flow is adapted to pass through the second heat sink.

7. The converter as claimed in claim 6, wherein the second heat sink is located between the first heat sink and the fan.

8. The converter as claimed in claim 6, wherein the circuit board unit comprises a first circuit board and a second circuit board, the relay is disposed on the first circuit board, the transformer and the output control unit are disposed on the second circuit board, the second circuit board comprises a first surface and a second surface, the first surface is opposite the second surface, the transformer is disposed on the first surface, and the output control unit is disposed on the second surface.

9. The converter as claimed in claim 8, wherein on a projection plane, a projection of the first circuit board, a projection of the capacitor, and a projection of the first heat sink partially overlap each other, and a projection of the second circuit board and a projection of the second heat sink partially overlap each other.

10. The converter as claimed in claim 8, wherein the housing further comprises a spacer, the spacer is disposed between the first circuit board and the capacitor, and the first circuit board is affixed to the spacer.

11. The converter as claimed in claim 6, further comprising a first stopper and a first waterproof ring, the first stopper has a first opening, the first heat sink covers the first opening, the first waterproof ring is embedded in the first stopper and abuts the first heat sink, and the first heat sink is thermally connected to the capacitor via the first opening.

12. The converter as claimed in claim 11, further comprising a second stopper and a second waterproof ring, the second stopper has a second opening, the second heat sink covers the second opening, the second waterproof ring is embedded in the second stopper and abuts the second heat sink, and the second heat sink is thermally connected to the output control unit via the second opening.

13. A converter, comprising:
a circuit board unit;
an adapter board, coupled to the circuit board unit, wherein the adapter board is perpendicular to the circuit board unit;
a capacitor, connected to the adapter board;
a first heat sink, thermally connected to the capacitor, wherein the first heat sink has a fin structure formed on a first side of the first heat sink, the capacitor is thermally connected to a second side of the first heat sink, and the first side is opposite to the second side; and
a heat conductive layer, wherein the heat conductive layer is sandwiched between the capacitor and the first heat sink, wherein the capacitor is directly connected to the heat conductive layer, and the heat conductive layer is directly connected to the first heat sink.

14. The converter as claimed in claim 13, wherein on a projection plane, a projection of the circuit board unit, a projection of the capacitor, and a projection of the first heat sink partially overlap each other.

15. The converter as claimed in claim 13, further comprising a relay, wherein the relay is disposed on the circuit board unit, and the relay corresponds to the capacitor.

16. The converter as claimed in claim 15, further comprising a transformer, an output control unit, a second heat sink and a fan, wherein the transformer and the output control unit are disposed on the circuit board unit, the transformer corresponds to the second heat sink, the second heat sink is thermally connected to the output control unit, the fan is adapted to generate an air flow, the air flow is adapted to pass through the first heat sink and the second heat sink, and the second heat sink is located between the first heat sink and the fan.

17. The converter as claimed in claim 16, wherein the circuit board unit comprises a first circuit board and a second circuit board, the relay is disposed on the first circuit board, the transformer and the output control unit are disposed on the second circuit board, the second circuit board comprises a first surface and a second surface, the first surface is opposite the second surface, the transformer is disposed on the first surface, and the output control unit is disposed on the second surface.

18. The converter as claimed in claim 17, wherein on a projection plane, a projection of the first circuit board, a projection of the capacitor, and a projection of the first heat sink partially overlap each other, and a projection of the second circuit board and a projection of the second heat sink partially overlap each other.

\* \* \* \* \*